United States Patent [19]

Rilly

[11] 4,322,663

[45] Mar. 30, 1982

[54] SWITCHED-MODE FIELD-SCANNING CIRCUIT OF VIDEO-FREQUENCY RECEIVER

[75] Inventor: Gerard Rilly, Paris, France

[73] Assignee: Thomson-Brandt, Paris, France

[21] Appl. No.: 58,982

[22] Filed: Jul. 20, 1979

[51] Int. Cl.³ .................... H01J 29/70; H01J 29/76
[52] U.S. Cl. ................................................. 315/408
[58] Field of Search ............... 315/399, 408, 411, 387, 315/396, 397

[56] References Cited

U.S. PATENT DOCUMENTS

| | | | |
|---|---|---|---|
| 3,835,348 | 9/1974 | Rhee | 315/387 |
| 3,845,352 | 10/1974 | Newman et al. | 315/397 |
| 3,939,380 | 2/1976 | Peer | 315/397 |
| 4,081,721 | 3/1978 | Haferl | 315/389 |
| 4,104,567 | 8/1978 | Peer et al. | 315/387 |

*Primary Examiner*—Theodore M. Blum
*Attorney, Agent, or Firm*—Roland Plottel

[57] ABSTRACT

The switched-mode field-scanning circuit makes use of a load constituted by a vertical deflector, a measuring resistor and a connecting capacitor. The load is connected to the output of a circuit which generates a sawtooth signal by means of the line-scanning retrace signal and has a single unidirectional-voltage, bi-directional-current channel.

The switched-mode field-scanning circuit is intended for use in transistorized video-frequency receivers.

7 Claims, 3 Drawing Figures

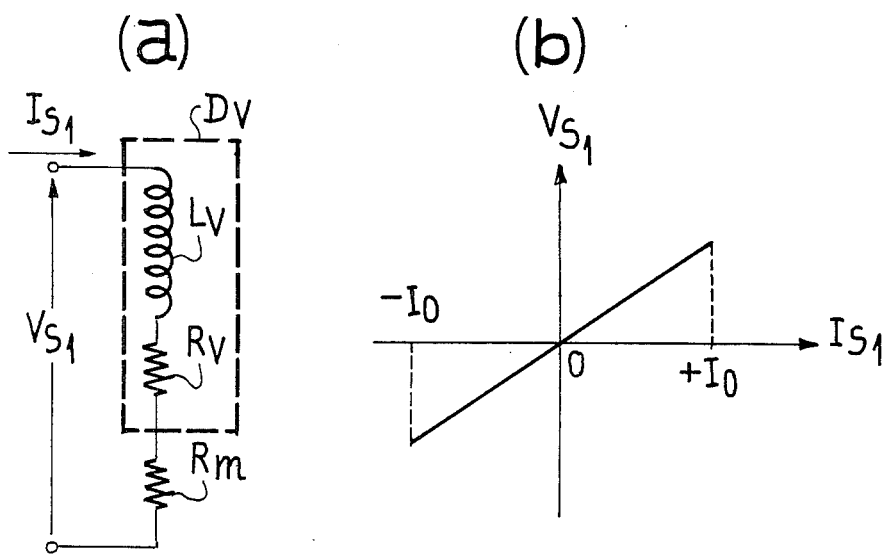
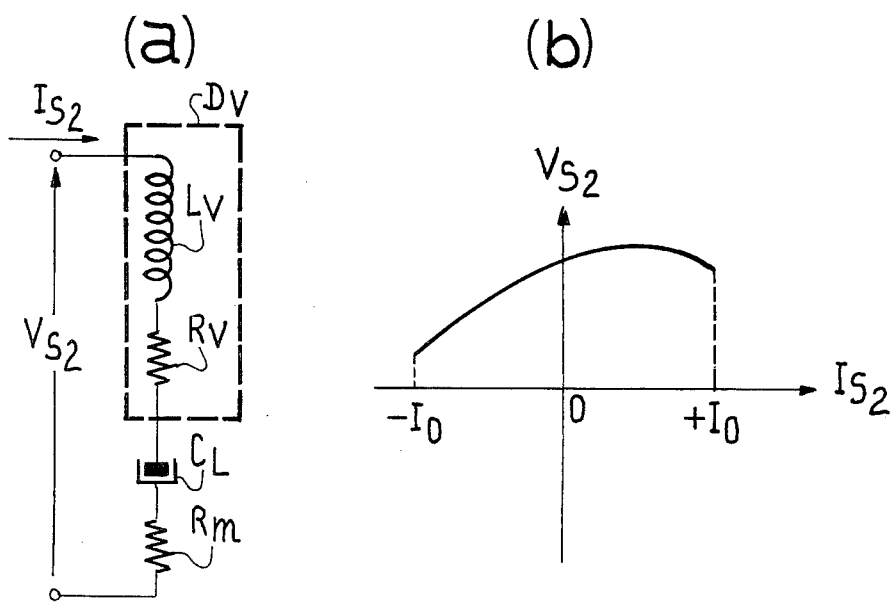

SWITCHED-MODE FIELD-SCANNING CIRCUIT OF VIDEO-FREQUENCY RECEIVER

This invention relates to a switched-mode field-scanning circuit of the type employed in television receivers.

A television image is obtained by displacement of a spot on the screen of a cathode-ray tube from left to right and from top to bottom.

Displacement of the spot from left to right is carried out by means of coils designated as horizontal-deflection coils or line-scanning coils carrying a current having a suitable waveform and displacement of the spot from top to bottom is carried out by coils designated as vertical-deflection coils or field-scanning coils.

Insofar as the vertical deflection coils are concerned, these latter carry a current which usually has a sawtooth waveform. In accordance with French standards, this current has a period of 20 ms and must have a field-scanning retrace time which is less than 1 ms.

In the case of a sawtooth waveform current, it is considered as a first approximation that the vertical deflection coils behave primarily as a resistance during the field-scanning forward stroke or trace corresponding to the visible portion on the screen which calls for good linearity and as an inductance during the field-scanning return stroke or retrace.

A large number of devices have been developed for generating this sawtooth current which is synchronized with the field frequency.

The devices employed in an initial stage of development were composed of a blocking oscillator for delivering a sawtooth voltage synchronized with the field frequency, a connecting stage having a high input impedance and a low output impedance, and an output stage for delivering to the vertical deflection coils the current having the necessary amplitude and waveform for vertical deflection of the spot of the cathode-ray tube. Said output stage could be a power amplifier biased in class A or alternatively a push-pull amplifier biased in class AB.

In a second stage of development, there appeared novel devices known as chopping devices.

In this case, two active switches such as thyristors or alternatively power transistors serve to apply line-scanning retrace pulses (therefore at the line frequency) to a capacitor mounted in parallel with the vertical deflection winding.

One of the two switches is closed for decreasing periods of time during the first half of the vertical-scanning trace or in other words the first half of a field in order to charge the capacitor by voltage pulses of decreasing width and of given polarity.

The second switch is closed for increasing periods of time during the second half of the vertical-scanning trace in order to charge the capacitor by voltage pulses having increasing widths and a polarity which is opposite to the preceding.

Discharge of the capacitor then produces a sawtooth current flow through the vertical deflection winding.

The system just mentioned therefore entails the need for two channels, namely a channel for vertical scanning of the upper half of the screen and a channel for vertical scanning of the lower half of said screen.

In practice, both channels must operate simultaneously in order to ensure that the two half-fields are correctly joined together at the center of the screen.

This choice of two channels having unidirectional current each in a different direction is imposed by the load, in other words by the vertical deflector (scanning-retrace inductance coil and scanning-trace series resistor) in series with a current-measuring resistor, which always behaves as an energy receiver and thus makes it necessary to ensure that the sawtooth generator is bidirectional both in current and in voltage.

The principal distinctive feature of the invention lies in the fact that switched-mode vertical scanning is carried out by means of only one channel or in other words by making use of only one active switch.

In point of fact and in accordance with the invention, the load is constituted by the vertical deflector in series with a connecting capacitor and with the resistor for measuring the current which flows through said deflector, and no longer behaves solely as an energy receiver since the terminal voltage of the load retains the same polarity irrespective of the direction of flow of current through the deflector if the mean value of the voltage at the terminals of the connecting capacitor is sufficiently high.

In this case, the sawtooth generator must be bidirectional in current and unidirectional in voltage.

In accordance with one characteristic feature of the invention, this system is carried into effect by means of a single active switch.

Further characteristic features of the invention will be brought out by the following description which is given by way of example and not in any limiting sense, reference being made to the accompanying drawings in which:

FIGS. 1(a) and (b) show the load impedance of a conventional sawtooth generator and provide a graphical representation of the voltage at the terminals of the generator as a function of the current which flows through this latter;

FIGS. 2(a) and (b) show the load impedance of a sawtooth generator according to the invention and provide a graphical representation of the voltage at the terminals of the generator as a function of the current which flows through this latter;

FIG. 3 is a diagram of a switched-mode field-scanning circuit according to the invention.

FIG. 1(a) represents the load impedance of a conventional field-scanning circuit comprising a vertical deflector Dv composed of an inductance coil Lv in series with a resistor Rv, and a resistor Rm for measuring the current which flows through the deflector.

Figure 2:
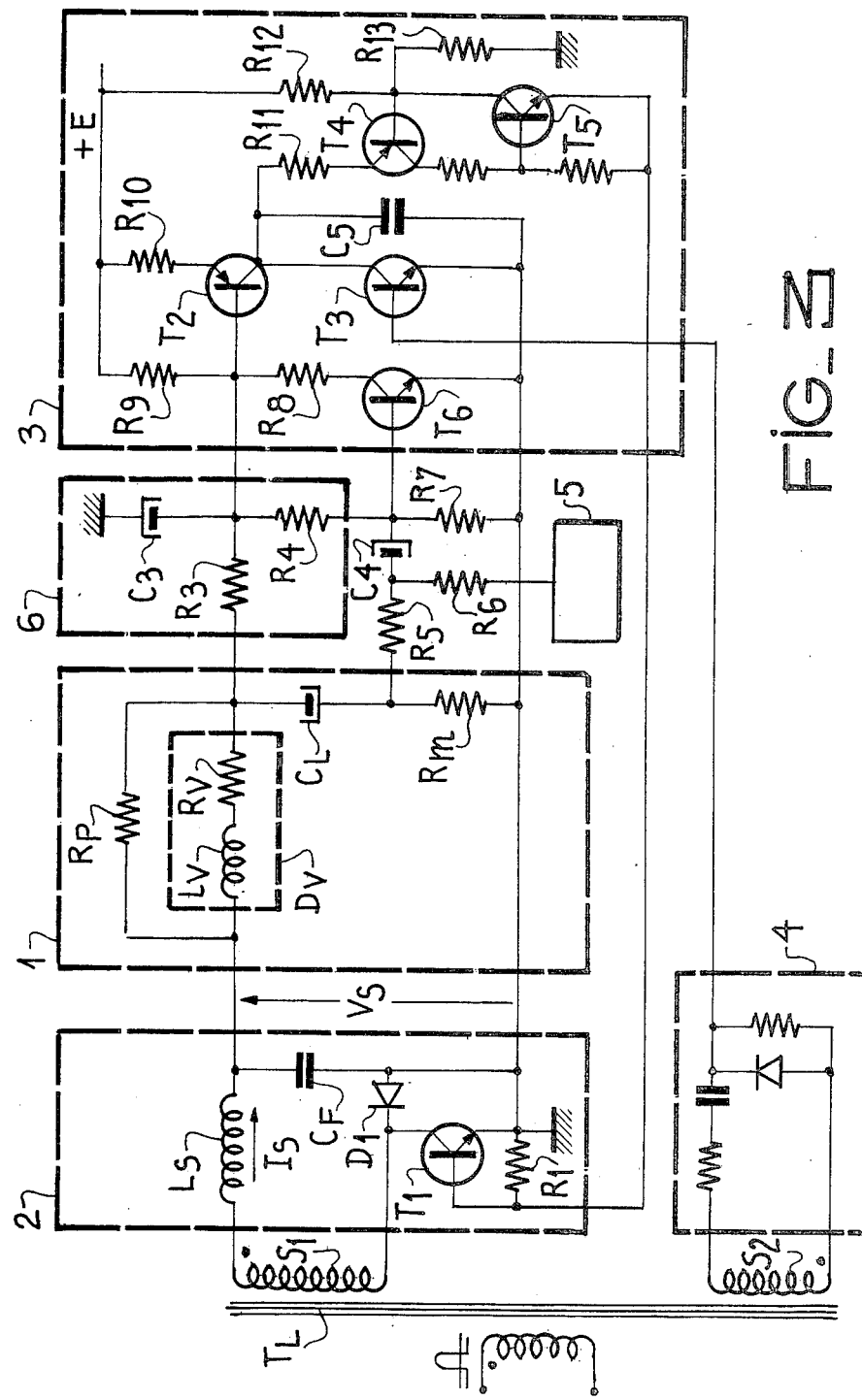

$V_{S1}$ represents the voltage at the terminals of said load and $I_{S1}$ represents the current. By convention, the arrows designate the case of a positive voltage.

FIG. 1(b) visualizes the values of the voltage $V_{S1}$ as a function of the values of the current $I_{S1}$.

The load always behaves as an energy receiver and works in the quadrants $V_{S1}$, $I_{S1}$ positive and $V_{S1}$, $I_{S1}$ negative. The current $I_{S1}$ varies between the limiting values $+I_o$ and $-I_o$ which represent the maximum positive and negative values of the current flowing through the deflector, wherein $+I_o$ corresponds to the start of a field scan (top of the screen) and $-I_o$ corresponds to the end of a field scan (bottom of the screen).

The voltage $V_{S1}$ follows as a function of the current $I_{S1}$ a straight line which passes through the zero point.

FIG. 2(a) represents the load impedance of a field-scanning circuit according to the invention. This load impedance is composed of a vertical deflector Dv, of a measuring resistor Rm and of a connecting capacitor $C_L$.

The voltage $V_{S2}$ represents the voltage at the terminals of said load and the current $I_{S2}$ represents the current flowing through this latter. By convention, the direction indicated by the arrows is that of positive voltage and current.

The capacitor $C_L$ is of the polarizable electrochemical type and is chosen so as to ensure that the mean value of its terminal voltage is sufficiently high and positive in accordance with the sign convention given above. In fact, this voltage will be added to the voltages at the terminals of the deflector DV and of the resistor Rm and, by virtue of its high value, will make it possible to obtain a voltage $V_{S2}$ which is always positive at the load terminals irrespective of the direction of the current flowing through the deflector; this applies within the current limits $-Io$ and $+Io$.

The voltage $V_{S2}$ as a function of the deflection current $I_{S2}$ is shown in FIG. 2(b).

In the case of a current which varies between the limiting values $-Io$ and $+Io$, the load works in the quadrants $V_{S2}$, $I_{S2}$ positive, and $V_{S2}$ positive, $I_{S2}$ negative. Said load therefore behaves as an energy receiver in an initial period and as a generator in a second period.

The sawtooth generator must therefore be unidirectional in voltage and bidirectional in current.

According to the invention, said generator is constructed by means of a single active switch as shown in FIG. 3.

In fact, FIG. 3 represents a diagram of a switched-mode field-scanning circuit in accordance with the invention.

The load 1 comprises the vertical deflector DV protected by a parallel resistor Rp, the connecting capacitor $C_L$ and the current-measuring resistor Rm. The load is connected to the terminals of a sawtooth signal generator circuit 2 by means of a control circuit 3 synchronized with the line frequency by a circuit 4.

Said circuit 2 generates a sawtooth signal within the vertical deflector DV by means of line-scanning retrace signals.

In fact, during the retrace interval, a periodic alternating-current signal at the line frequency appears in the secondary windings of the line transformer.

The sawtooth current is obtained by chopping said alternating-current signal which is produced in an auxiliary secondary winding of the line transformer. Chopping is carried out by means of an active switch which is bidirectional in current and unidirectional in voltage. Said switch is connected in series with the winding $S_1$ as well as with an inductance coil $L_S$ which is not coupled to the line transformer, the complete assembly being mounted in parallel with a filter capacitor $C_F$.

The value chosen for the capacitor $C_F$ is sufficiently high to ensure that the alternating-current portion of the voltage across the capacitor terminals is very small compared with the signal applied to the terminals of the winding $S_1$ and therefore negligible.

The active switch comprises a diode $D_1$ mounted in parallel with an n-p-n-type transistor $T_1$. The collector of said transistor is connected to the cathode of the diode whilst the emitter is connected on the one hand to the anode of the diode and on the other hand to ground. The base of the transistor is connected to ground through a resistor $R_1$ and to a control circuit 3.

The transistor can also be of the p-n-p-type, in which case its emitter is connected to the cathode of the diode and to the non-grounded terminal of the capacitor $C_F$. The collector of said transistor is connected to the anode of the diode and to one terminal of the inductance coil Ls.

It is also possible to employ a thyristor in parallel with a diode or alternatively any other active switch.

Said transistor $T_1$ operates as a switch; in other words, when its base current is of sufficient value to produce saturation, the transistor short-circuits the diode $D_1$.

An active switch of this type as composed of the transistor $T_1$ and of the diode $D_1$ is bidirectional in current and unidirectional in voltage. In fact, currents of opposite direction can pass through the switch when this latter is closed whereas a voltage of predetermined polarity corresponding to the inverse voltage of the diode $D_1$ appears across the terminals of said switch when this latter is opened.

During the field-scanning trace or forward interval, the winding $S_1$ of the line transformer $T_L$ delivers line retrace pulses of practically sinusoidal waveform. The capacitor $C_F$ constitutes in conjunction with the inductance coil $L_V$ of the vertical deflector $D_V$ a low-pass filter having high transmission efficiency for the line frequency and the current which flows through the deflector is practically equal to the mean value of the current $I_S$ flowing through the inductance coil $L_S$.

In order to gain a more complete understanding of the invention, it will accordingly be assumed in an initial stage that the transistor $T_1$ is always open or in other words that no signal is applied to its base.

In this case, the voltage generated by the secondary winding $S_1$ which is periodic at the line frequency is rectified by the diode $D_1$ and filtered by the low-pass filter formed by the inductance coil $L_V$ and the capacitor $C_F$ which is of sufficiently high value to ensure that a negligible alternating-current voltage appears across the terminals of said capacitor.

The terminal voltage of the capacitor $C_F$ is therefore a positive d.c. voltage and thus imposes a positive d.c. voltage on the terminals of the load 1.

The terminal voltage of the inductance coil $L_S$ is equal to the voltage at the terminals of the secondary winding $S_1$ minus the voltage $V_S$ at the terminals of the capacitor $C_F$ as long as a direct current flows through the diode $D_1$; thus said terminal voltage is practically zero.

The waveform of the voltage at the terminals of the conductance coil $L_S$ is therefore similar to the waveform of the voltage at the terminals of the inductance winding $S_1$ throughout the period of conduction of the diode $D_1$. When the diode $D_1$ is cut-off, said voltage is zero.

From the instant at which the voltage at the terminals of the inductance winding $S_1$ becomes positive, a direct current flows through the diode $D_1$ and the voltage at the terminals of the inductance coil $L_S$ is positive. The voltage at the terminals of the inductance coil $L_S$ therefore assumes the shape of a positive sine-wave which is similar to that of the voltage at the terminals of the winding $S_1$ up to the instant of finish of a line retrace interval, at which said voltage assumes a negative value and maintains this value until the instant of cut-off of the diode $D_1$, that is to say at the instant of nullification of the current within the circuit and therefore nullification of the current in the inductance coil $L_S$.

In point of fact, the current flowing through the inductance coil $L_S$ increases as long as the voltage across the terminals of said coil is positive, then decreases linearly until it attains a zero value when it becomes negative.

Since the mean current through the capacitor $C_F$ is zero, the current through the vertical deflector is equal to the mean current through the inductance coil $L_S$.

In the particular case in which the transistor $T_1$ is always cut-off, said mean current is therefore positive.

It will now be supposed that the transistor $T_1$ is closed by applying a signal having a sufficient level to the base of said transistor through the control circuit 3 at an instant preceding the instant of commencement of a line retrace interval. The diode $D_1$ which had been biased by a negative voltage imposed by the voltage across the terminals of the secondary winding $S_1$ and which had been cut-off is accordingly short-circuited. The active switch $T_1$, $D_1$ is therefore closed and the voltage at the terminals of the diode $D_1$ is zero.

As long as this voltage is zero, the voltage at the terminals of the inductance coil $L_S$ is equal to the voltage at the terminals of the winding $S_1$ minus the voltage at the terminals of the capacitor $C_F$ which is a positive d.c. voltage.

The voltage at the terminals of the winding $L_S$ is therefore constant and negative up to the instant of commencement of line retrace at which said voltage begins to increase in accordance with a sinusoidal waveform which is similar to that of the voltage at the terminals of the winding $S_1$. After a positive maximum at the mid-point of the line retrace interval, said voltage decreases to a negative value at the instant of completion of the line retrace, said value being retained until the current within the circuit is reduced to zero or in other words until the current within the inductance coil $L_S$ is reduced to zero.

Since the voltage at the terminals of the inductance coil $L_S$ is initially negative, the current flowing through said coil is negative and decreases linearly to a minimum value. The instant of said minimum value corresponds to the instant at which the voltage at the terminals of the coil $L_S$ falls to zero before becoming positive. After this instant, the current within the inductance coil $L_S$ increases, falls to zero at the instant at which the terminal voltage of the coil $L_S$ is at a maximum and attains a positive maximum at the instant at which the voltage reverts to zero before again becoming negative. After this instant, the current decreases linearly to zero.

Since the mean current through the capacitor $C_F$ is zero, the current which flows through the vertical deflector $D_V$ is equal to the mean current which flows through the inductance coil $L_S$.

Since the waveform of the current within the inductance coil $L_S$ is dependent on the instant of closure of the transistor $T_1$, its mean current is also dependent thereon and the same applies to the current which flows through the vertical deflector.

The more the transistor $T_1$ is turned-on at an instant which leads on the instant of commencement of line retrace, the more the mean current within the inductance coil $L_S$ decreases with respect to its maximum value corresponding to the case in which the transistor $T_1$ is always cut-off.

It is therefore possible to control the value of the mean current within the inductance coil $L_S$ and therefore the value of current within the deflector by controlling the instant of turn-on of the transistor $T_1$.

During the field-scanning trace or forward interval, it is therefore only necessary to control the successive instants of turn-on of the transistor $T_1$ in a suitable manner in order to ensure that the current flowing through the vertical deflector follows a sawtooth law.

At the start of a field-scanning retrace interval, the initial electrical conditions are: a zero alternating-current voltage at the terminals of the capacitor $C_F$, a positive voltage at the terminals of the capacitor $C_L$ and a current within the vertical deflector $D_V$ equal to a minimum value which is designated as $-Io$.

By virtue of these initial conditions, the circuit formed by the load 1 and the capacitor $C_F$ enters into resonance at the tuning frequency determined by the inductance coil $L_V$ and the capacitor $C_F$.

At the end of one half-cycle of the tuning period, the current within the vertical deflector $D_V$ is reversed and attains a positive maximum value equal to $+Io$.

The vertical or field retrace time is therefore given by the time-duration corresponding to complete reversal from $-Io$ to $+Io$.

Suitable control of the transistor $T_1$ is carried out by the circuit 3 shown in FIG. 3.

This circuit ensures turn-on of the transistor $T_1$ by injecting a signal of suitable level into its base at an instant which depends on the current as well as on the output voltage and on the voltage delivered by the secondary winding $S_1$ of the line transformer.

The base of a transistor $T_6$ is connected through a connecting capacitor $C_4$ and a resistor $R_5$ to one terminal of the measuring resistor Rm.

Furthermore, a circuit 5 for producing a corrected sawtooth voltage or in other words a very good image of the waveform of the current required for good vertical deflection is connected through the resistors $R_6$ and $R_5$ to one terminal of the measuring resistor Rm.

Said corrected sawtooth voltage is accordingly compared with the voltage appearing across the terminals of the resistor Rm via the bridge constituted by resistors $R_6$, $R_5$.

The transistor $T_6$ as well as the transistor $T_2$ connected in series with $T_6$ amplify any dynamic error signal between the voltage across the terminals of the resistor Rm and the corrected sawtooth voltage.

In point of fact, the voltage across the terminals of Rm is a function of the current flowing through the vertical deflector $D_V$.

The error signal is therefore a function of the difference between the vertical deflection current and the corrected sawtooth voltage.

The amplifier formed by the transistors $T_6$, $T_2$ is biased by the resistors $R_7$, $R_8$, $R_9$, $R_{10}$.

The collector current of transistor $T_2$ which is a function of the base current of transistor $T_6$ is therefore a function of the difference between the voltage across the terminals of the resistor Rm and the corrected sawtooth voltage.

The collector current of transistor $T_2$ charges a capacitor $C_5$ which is connected between the collector of transistor $T_2$ and ground.

A transistor $T_3$ is mounted in parallel with the capacitor $C_5$, the collector of said transistor being connected to the collector of transistor $T_2$ and the emitter being connected to ground. The base of said transistor $T_3$ is connected to a synchronizing circuit 4 which supplies from the line retrace pulses derived from an auxiliary secondary winding $S_2$ of the line transformer, a square-wave signal for controlling the transistor $T_3$.

At a zero level of said signal, transistor $T_3$ is cut-off. When the signal assumes a value given by the intrinsic characteristics of transistor $T_3$, said transistor is triggered into conduction and short-circuits the capacitor $C_5$, with the result that a bistable circuit consisting of two transistors $T_4$ and $T_5$ is thus made non-conducting exactly at the end of a line pulse.

In fact, the input of said bistable circuit (emitter of transistor $T_4$) is connected through a resistor $R_{11}$ to the collector output of transistor $T_2$.

Said bistable circuit is biased by the resistors $R_{12}$, $R_{13}$.

When the transistor $T_3$ is turned-on, the capacitor $C_5$ is charged by the collector current of transistor $T_2$ which is a function of the difference between the voltage across the terminals of resistor $R_m$ and the corrected voltage.

When the value of the voltage across the terminals of capacitor $C_5$ exceeds the value of the voltage applied to the base of transistor $T_4$ through the resistor bridge $R_{12}$, $R_{13}$, the bistable circuit $T_4$, $T_5$ which had previously been in the non-conducting state accordingly becomes conducting, applies a signal to the base of transistor $T_1$ when then short-circuits the diode $D_1$. This state is maintained until transistor $T_3$ is triggered into conduction, short-circuits capacitor $C_5$ and restores the bistable circuit $T_4$, $T_5$ to the nonconducting state immediately at the end of the following line pulse.

The instant of turn-on of transistor $T_1$ is directly dependent on the slope of the charging voltage of capacitor $C_5$, therefore on the collector current of transistor $T_2$ and consequently on the difference between the current within the vertical deflector and the reference signal delivered by the circuit 5.

When the voltage within resistor $R_m$ increases, the collector current of transistor $T_2$ increases, the slope of the voltage at the terminals of capacitor $C_5$ increases, the instant of turn-on of transistor $T_1$ is advanced in time, the current within the deflector decreases, and consequently the voltage at the terminals of resistor $R_m$ decreases. This accordingly results in a regulating loop.

The dynamic control thus achieved is such that the current which flows through the deflector is the image of the corrected sawtooth voltage delivered by the circuit 5.

Furthermore, in order to ensure good operation of the circuit according to the invention, the mean value of the voltage at the terminals of the capacitor $C_L$ must be sufficiently high and stable. Stability is ensured by means of the loop 6 which is connected between the collector of the transistor $T_6$ and the vertical deflector $D_V$.

Said loop is constituted on the one hand by a polarized capacitor $C_3$ and on the other hand by two resistors $R_3$, $R_4$ which also apply a bias to the base of transistor $T_6$. Said loop makes it possible to control the mean charge of capacitor $C_L$ and thus to ensure its stability.

The switched-mode scanning circuit according to the invention therefore operates by means of only one active switch and therefore only one channel, thus offering an advantage over known switched-mode circuits of the prior art in that it calls for the use of one-half the number of components.

The field-scanning circuit according to the invention is primarily employed in transistorized television receivers.

What is claimed is:

1. A switched-mode field-scanning circuit wherein the input energy is delivered by a secondary winding of the line transformer of a television receiver providing line-scanning retrace signals, and this energy is provided to a circuit for generating the sawtooth signal at the field frequency which comprises a single active bidirectional current and unidirectional-voltage switch, the conduction of which is controlled by a control circuit in order to vary from line to line at each line-scanning period, the sawtooth signal generated by said circuit being delivered to the vertical deflector which is connected in series with a connecting capacitor having a sufficiently high capacity to ensure that the terminal voltage of an assembly thus formed retains the same polarity irrespective of the direction of the current flowing through said vertical deflector.

2. A switched-mode field-scanning circuit according to claim 1, wherein the voltage across the terminals of the connecting capacitor is made sufficiently high and stable to ensure optimum operation of the field-scanning circuit by means of a circuit for controlling the mean charge of said connecting capacitor, said control circuit being connected in parallel with said capacitor.

3. A switched-mode field-scanning circuit according to claim 1, wherein the control circuit comprises a comparator stage for delivering an error signal as a function of the difference between the current within the vertical deflector and a corrected sawtooth signal delivered by a circuit, and a driver stage for controlling the switch in such a manner as to ensure that the sawtooth signal thus delivered tends to reduce the error signal to zero and the current flowing through the deflector thus tends to recopy the waveform of the corrected sawtooth signal.

4. A switched-mode field-scanning circuit according to claim 1, wherein the sawtooth signal generator circuit comprises, in series with said secondary winding and said switch, an inductance coil and a filtering capacitor, and the vertical deflector and the connecting capacitor being connected to the terminals of said capacitor.

5. A switched-mode field-scanning circuit according to claim 4, wherein a measuring resistor is in series with said vertical deflector and connecting capacitor, this assembly being in parallel with said filtering capacitor.

6. A switched-mode field-scanning circuit according to claim 1, wherein the active switch of the sawtooth signal generator circuit comprises a diode and a transistor mounted in parallel but in reverse directions, the base of said transistor being connected to said control circuit.

7. A switched-mode field-scanning circuit according to claim 1, wherein the active switch of the sawtooth signal generator circuit comprises a diode and a thyristor mounted in parallel but in reverse directions, the gate of said thyristor being connected to said control circuit.

* * * * *

UNITED STATES PATENT OFFICE
CERTIFICATE OF CORRECTION

Patent No. 4,322,663            Dated March 30, 1982

Inventor(s) Gerard Rilly

It is certified that error appears in the above-identified patent and that said Letters Patent are hereby corrected as shown below:

Title page, left column, after "[22] Filed: July 22, 1979" add the following new lines:

-- [30] foreign Application Priority Date
July 27, 1978 [FR] France ........... 78 22266 --

Signed and Sealed this

Second Day of August 1983

[SEAL]

Attest:

GERALD J. MOSSINGHOFF

Attesting Officer                Commissioner of Patents and Trademarks